United States Patent
Maruyama et al.

(10) Patent No.: US 8,513,986 B2
(45) Date of Patent: Aug. 20, 2013

(54) DRIVING CIRCUIT FOR SWITCHING ELEMENT AND POWER CONVERTER

(75) Inventors: Sho Maruyama, Machida (JP); Yoshiyuki Kikuchi, Shiraoka-machi (JP)

(73) Assignees: Nissan Motor Co., Ltd., Yokohama-shi (JP); Calsonic Kansei Corporation, Saitama-shi (JP)

( * ) Notice: Subject to any disclaimer, the term of this patent is extended or adjusted under 35 U.S.C. 154(b) by 0 days.

(21) Appl. No.: 13/503,151

(22) PCT Filed: Oct. 15, 2010

(86) PCT No.: PCT/JP2010/068128
§ 371 (c)(1),
(2), (4) Date: Apr. 20, 2012

(87) PCT Pub. No.: WO2011/052398
PCT Pub. Date: May 5, 2011

(65) Prior Publication Data
US 2012/0206174 A1    Aug. 16, 2012

(30) Foreign Application Priority Data
Oct. 26, 2009    (JP) ................. 2009-245625

(51) Int. Cl.
*H03K 3/00*    (2006.01)

(52) U.S. Cl.
USPC ........... 327/109; 327/108; 327/110; 327/111; 326/82

(58) Field of Classification Search
USPC .................... 327/108–111; 326/82
See application file for complete search history.

(56) References Cited

U.S. PATENT DOCUMENTS

| | | | |
|---|---|---|---|
| 5,384,516 A * | 1/1995 | Kawabata et al. | 315/160 |
| 5,929,665 A * | 7/1999 | Ichikawa et al. | 327/109 |
| 6,339,236 B1 | 1/2002 | Tomii et al. | |
| 7,969,206 B2 * | 6/2011 | Ito | 327/108 |
| 8,129,934 B2 * | 3/2012 | Ando | 318/696 |
| 8,222,827 B2 * | 7/2012 | Kuennen et al. | 315/224 |
| 2001/0026429 A1 | 10/2001 | Fukuda et al. | |
| 2009/0206788 A1 * | 8/2009 | Ando | 318/696 |
| 2012/0025875 A1 * | 2/2012 | Fukuta et al. | 327/109 |
| 2012/0092896 A1 * | 4/2012 | Hachiya et al. | 363/16 |
| 2012/0206174 A1 * | 8/2012 | Maruyama et al. | 327/109 |
| 2012/0218669 A1 * | 8/2012 | Ioannidis et al. | 361/18 |
| 2012/0249020 A1 * | 10/2012 | Komatsu et al. | 318/139 |
| 2013/0043817 A1 * | 2/2013 | Shibuya et al. | 318/400.33 |
| 2013/0049718 A1 * | 2/2013 | Berkhout et al. | 323/271 |
| 2013/0083576 A1 * | 4/2013 | Gan et al. | 363/123 |
| 2013/0094258 A1 * | 4/2013 | Royak et al. | 363/89 |

FOREIGN PATENT DOCUMENTS

| | | |
|---|---|---|
| JP | 61-052010 A | 3/1986 |
| JP | 03-040517 A | 2/1991 |
| JP | 05-304771 A | 11/1993 |
| JP | 06-053795 A | 2/1994 |

(Continued)

*Primary Examiner* — Adam Houston
(74) *Attorney, Agent, or Firm* — Foley & Lardner LLP

(57) ABSTRACT

A short-circuit protection circuit (12) configured to protect a switching element from an overcurrent includes: a potential decreasing means for decreasing a potential of a gate terminal when a main circuit current is an overcurrent; a feedback means for performing feedback control on an amount of a decrease in the gate potential caused by the potential decreasing means according to a current amount of the main circuit current; and a phase advancing means for performing phase advance compensation in a feedback loop under the feedback control.

7 Claims, 6 Drawing Sheets

(56) References Cited

FOREIGN PATENT DOCUMENTS

| | | |
|---|---|---|
| JP | 9-64707 A | 3/1997 |
| JP | 10-32476 A | 2/1998 |
| JP | 2001-193615 A | 7/2001 |
| JP | 2001-284623 A | 10/2001 |
| JP | 2001-345688 A | 12/2001 |
| JP | 3680722 B2 | 8/2005 |
| JP | 2008-177707 A | 7/2008 |
| JP | 2009-100552 A | 5/2009 |

* cited by examiner

DRIVING CIRCUIT FOR SWITCHING ELEMENT AND POWER CONVERTER

TECHNICAL FIELD

The present invention relates to a driving circuit for a switching element and a power converter.

BACKGROUND ART

In general, a short-circuit protection circuit is provided to a driving circuit for a switching element included in a power converter such as an inverter, for the safety reason. The short-circuit protection circuit is required to not only prevent the switching element from being destroyed due to heat which is caused by an overcurrent when a short circuit happens, but also prevent the switching element from being broken down due to a breakdown voltage which is caused by a surge voltage generated when the overcurrent is cut off.

Japanese Patent Application Publication No. 2001-345688 discloses a semiconductor switching element driving circuit. The driving circuit includes an overcurrent limiting circuit and an overcurrent protection circuit. The overcurrent limiting circuit is configured to instantaneously decrease a voltage of a gate terminal once a collector current becomes larger than a first value. The overcurrent protection circuit is configured, first, to decrease the collector current with a first inclination once the collector current becomes larger than a second value, and then, to decrease the collector current with a steep second inclination once the collector current becomes smaller than a third value.

In addition, Japanese Patent No. 3680722 discloses an overcurrent protection circuit of a switching element. The protection circuit includes: a gate voltage holding means for holding a gate voltage at a set value; a gate current increasing means for increasing a gate current temporarily to decrease the gate voltage quickly; and a gate current suppressing means for changing the gate voltage moderately to the set value after the operation of the gate current increasing means.

SUMMARY OF INVENTION

Technical Problem

Meanwhile, the circuits disclosed in the aforementioned documents each employ feedforward control as control for decreasing a gate potential at the time of the overcurrent. For this reason, a current oscillation occurs depending on the variation in characteristics and the temperature of a switching element, and is likely to cause a breakdown of the switching element.

The present invention has been made in view of such circumstances. An object of the invention is to prevent a breakdown of a switching element by suppressing a current oscillation regardless of the variation in characteristics and the temperature of the switching element.

Solution to Problem

An aspect of the present invention is a switching element driving circuit including: a control circuit configured to cause a main circuit current to flow in a main circuit by applying a control voltage to a first terminal of a switching element; and a protection circuit configured to protect the switching element when the main circuit current is an overcurrent. The protection circuit includes: a potential decreasing means for decreasing a potential of the first terminal when the main circuit current is an overcurrent; a feedback means for performing feedback control on an amount of the decrease in the potential in the first terminal, which is caused by the potential decreasing means, according to a current amount of the main circuit current; and a phase advancing means for performing phase advance compensation in a feedback loop under the feedback control.

DESCRIPTION OF EMBODIMENTS

[First Embodiment]

Figure 1:
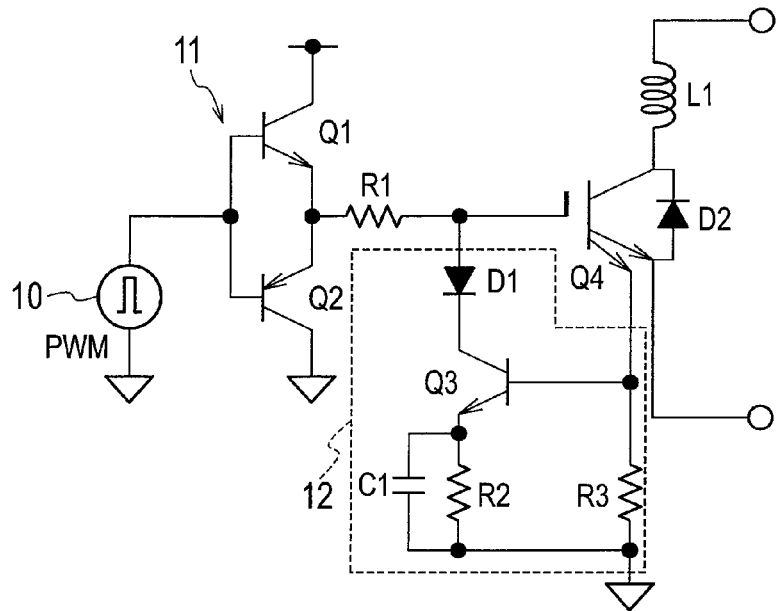
FIG. 1 is a circuit configuration diagram showing a driving circuit for a switching element according to a first embodiment of the present invention.

A driving circuit for a switching element according to a first embodiment of the present invention is a circuit used for driving a switching element included in a power converter such as an inverter for controlling a motor. As shown in FIG. 1, the driving circuit mainly includes a logic circuit 10, a gate driver (control circuit) 11, a switching element (IGBT: Insulated Gate Bipolar Transistor) Q4, and a short-circuit protection circuit 12.

Note that in this embodiment, a description is given of an example in which an IGBT including a gate terminal (a first terminal), a collector terminal (a second terminal), and an emitter terminal (a third terminal) is used as a switching element, but the switching element is not limited to the IGBT. For example, a MOS-FET (Metal-Oxide-Semiconductor Field-Effect Transistor) including a gate terminal (a first terminal), a source terminal (a second terminal), and a drain terminal (a third terminal) may be used as the switching element as well.

The logic circuit 10 performs control so that the gate driver 11 turns on or off in response to an input signal (not illustrated) such as a PWM signal. The gate driver 11 is made from a push-pull circuit including a source driver Q1 and a sink driver Q2 between which the logic circuit 10 performs switching. A connecting point between the source driver Q1 and the sink driver Q2 is connected to a gate terminal of the IGBT Q4 via a gate resistor R1.

The IGBT Q4 is a switching element driven by the driving circuit. In this embodiment, the IGBT Q4 and a free-wheel diode D2 are connected together in reverse parallel between the collector terminal and the emitter terminal of the IGBT Q4, and a coil L1 is connected to the collector terminal of the IGBT Q4. The driving circuit is configured such that the logic circuit 10 applies a voltage (a control voltage) to the gate terminal of the IGBT Q4 through the gate driver 11 and thereby a collector current (a main circuit current) flows in a main circuit between the collector terminal and the emitter terminal of the IGBT Q4.

The short-circuit protection circuit 12 functions as a protection circuit configured to protect the IGBT Q4 when the main circuit current becomes an overcurrent. The short-circuit protection circuit 12 includes: a sense resistor R3 connected to a sense terminal branched from part of the emitter of the IGBT Q4; and an NPN transistor Q3, a collector terminal of which is connected to the gate terminal of the IGBT Q4 via a diode D1. The sense terminal of the IGBT Q4 is a current detecting terminal in which a current (a sense current) proportional to the collector current of the IGBT Q4 flows. A base terminal of the NPN transistor Q3 is connected to a connecting point between the sense terminal of the IGBT Q4 and the sense resistor R3. When the sense current flows via the sense terminal of the IGBT Q4, the sense resistor R3 works as a current detecting means, and turns on the NPN transistor Q3 based on a voltage generated by the sense resistor R3. In addition, in the short-circuit protection circuit 12, a resistor R2 is connected to an emitter terminal of the NPN transistor Q3, and a capacitor C1 is connected to the resistor R2 in parallel.

Next, a description is given of the operation of the driving circuit for a switching element according to this embodiment. In the first place, during the normal operation in which no short circuit occurs, the IGBT Q4 is driven by the gate register R1 and the gate driver 11 (the source driver Q1 and the sink driver Q2). Since the NPN transistor Q3 is off during this time, the electricity of the capacitor C1 is discharged by the resistor R2.

In contrast, when a short circuit occurs, an overcurrent flows in the main circuit between the collector and the emitter of the IGBT Q4. Thereby, a current flowing in the sense terminal of the IGBT Q4 increases in proportion thereto, and a base potential of the NPN transistor Q3 rises due to the sense resistor R3. Once the base potential exceeds a threshold potential of the NPN transistor Q3, the NPN transistor Q3 turns on. Thereby, a current flows through the capacitor C1, the resistor R2 and the diode D1, and a potential (a gate potential) of the gate terminal of the IGBT Q4 accordingly decreases.

Note that the resistor R2 causes an emitter potential of the NPN transistor Q3 to rise according to the current causing the gate potential of the IGBT Q4 to decrease, and thus has an effect of negative feedback. The resistor R2 also has a function of determining a current value of the main circuit current at the time when the main circuit current enters a steady state after the NPN transistor Q3 turns on. This is because the gate potential of the IGBT Q4 is determined mainly based on a ratio between the resistor R1 and the resistor R2.

Meanwhile, the capacitor C1 is connected to the resistor R2 in parallel in this embodiment. During the transition, the capacitor C1 works to quickly decrease the gate potential of the IGBT Q4 immediately after the NPN transistor Q3 turns on. In a feedback system which will be described later, the capacitor C1 has an effect of advancing a phase.

Figure 2:
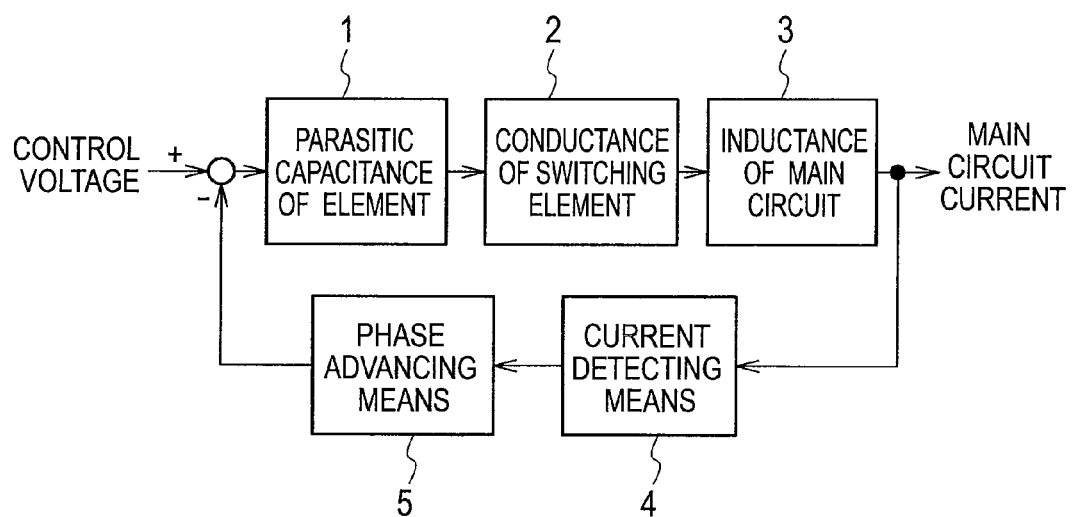
FIG. 2 is a control block diagram of a circuit including the switching element and a short-circuit protection circuit 12 which are shown in FIG. 1.

Specifically, as shown in FIG. 2, a circuit including the IGBT Q4 and the short-circuit protection circuit 12 in the driving circuit for a switching element according to this embodiment receives a voltage applied to the gate terminal of the switching element, and outputs the main circuit current. The circuit includes a feedback loop including: a serial connection of a parasitic capacitance 1 of the switching element, a conductance 2 of the switching element, and a parasitic inductance 3 of the main circuit; and a serial connection of a current detecting means 4 for detecting a current amount of the main circuit current and a phase advancing means 5 for performing phase advance compensation.

In addition, from a functional viewpoint, the short-circuit protection circuit 12 in the driving circuit for a switching element according to this embodiment includes a potential decreasing means, a feedback means, and the phase advancing means 5. The potential decreasing means takes on the function of decreasing the potential of the gate terminal of the IGBT Q4 when the main circuit current becomes an overcurrent. The potential decreasing means mainly includes the sense resistor R3, the NPN transistor Q3, and the diode D1 in the short-circuit protection circuit 12, and decreases the potential of the gate terminal of the NPN transistor Q3 via the diode D1 by making the NPN transistor Q3 conduct based on a voltage generated due to the sense resistor R3 connected to the sense terminal of the IGBT Q4. In contrast, the feedback means takes on the function of performing feedback control on an amount of the decrease in the gate potential, which is caused by the potential decreasing means, according to a current amount of the main circuit current, and includes the resistor R2 connected to the emitter terminal of the NPN transistor Q3. Meanwhile, the phase advancing means 5 takes on the function of performing phase advance compensation in a feedback loop under the feedback control, and includes the capacitor C1 connected to the resistor R2 in parallel on the emitter side of the NPN transistor Q3.

Next, a description is given of a concept of control performed by the short-circuit protection circuit 12 according to this embodiment. A conventional short-circuit protection circuit is configured as follows. For example, when a short circuit occurs, a gate potential is quickly decreased by quickly extracting gate charges in as shortest time as possible, so that the rise of a short-circuit current is suppressed while the first priority is given thereto. Then, the gate potential is decreased slowly by a circuit configured to decrease the gate potential slowly, so that a surge voltage at the time of current cutoff is suppressed. The circuit as described above is configured such that: a transistor operates simply as a switch; and continuous feedback control according to an amount of the short-circuit current is not performed once the transistor operates as the switch. In sum, the decreasing rate of the gate potential is fixed at a predetermined rate based on a predetermined circuit constant. From the above, it can be said that control for short-circuit protection in the conventional short-circuit protection circuit is feedforward control.

Meanwhile, a variation in the threshold of the gate is known as the general characteristic of IGBTs. The variation is likely to cause the following problems. For example, at the time of a short-circuit protection operation, an IGBT having a high threshold has a gate potential decrease too much relative to a threshold thereof. A current is quickly cut off, but a surge voltage is likely to become excessive. Also, in a case where a circuit constant is adjusted in such a manner as to decrease a gate potential slowly so as to prevent the excessive surge voltage, an IGBT having a low threshold does not make it possible to suppress a current sufficiently at the time of the short-circuit protection operation, so that the element is likely to be broken due to overheat. When the aforementioned feedforward control is used to coping with such problems, a circuit constant needs to be adjusted for each IGBT in use. This leads to a cost increase. Moreover, the characteristics of the IGBT change depending on the temperature. In this case, too, a problem similar to the above is likely to occur.

Figure 3:
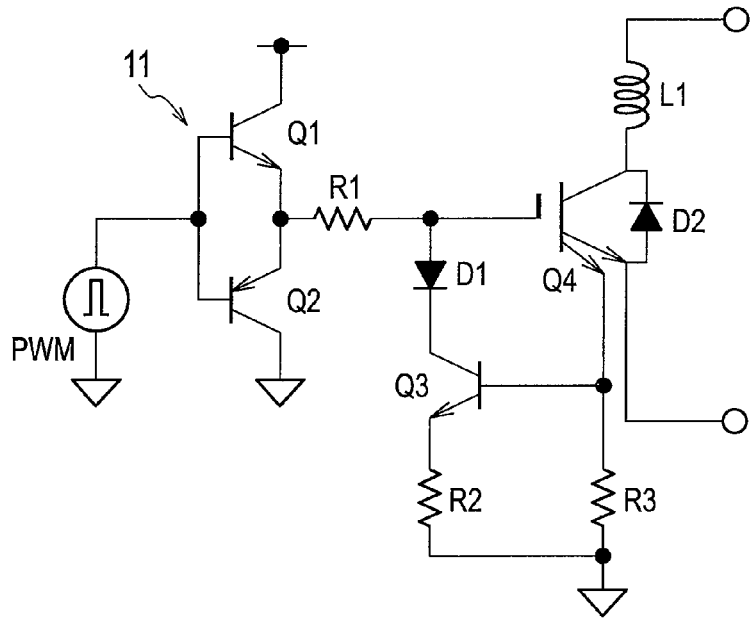
FIG. 3 is a circuit configuration diagram for explaining a short-circuit protection circuit under feedback control.

A conceivable circuit configuration of a short-circuit protection circuit capable of dealing with the problems is one configured to suppress a current oscillation by continuously performing feedback control on a gate potential according to a current amount of a main circuit current after detecting an overcurrent attributable to a short-circuit. For example, as shown in FIG. 3, when a resistor R2 is provided on the emitter side of an NPN transistor Q3, it is possible to build a feedback circuit capable of adjusting an amount of the decrease in the gate potential according to the current amount of the main circuit current. The resistor R2 has a function of determining the final gate potential in the short-circuit protection operation, and has an effect of increasing an emitter potential of the NPN transistor Q3 against the amount of a short-circuit current. The resistor R2 works as negative feedback, and prevents the current oscillation. This feedback circuit makes it possible to control the gate potential according to the current amount of the overcurrent (main circuit current), and thus to cope with the variation of the characteristics of the aforementioned IGBT.

However, because the feedback circuit might cause an oscillation when the system in the short-circuit protection circuit is unstable, the system need be stable. For example, components considerably contributing to the stability of the feedback loop include a first-order lag due to a parasitic inductance of the main circuit and a first-order lag due to a parasitic capacitance of the switching element, and thus a second-order lag system based on the two lag components is formed (see Parts (1) and (3) of FIG. 2). In this system, a margin of phase lag might become small depending on the circuit characteristic. In addition, one may possibly consider that because an input signal becomes fast for the sake of the short-circuit protection and has a high-frequency component, this results in a condition easily causing an oscillation.

Hence, as shown in FIG. 2, the driving circuit for a switching element according to this embodiment includes the phase advancing means 5 for performing phase advance compensation in the feedback loop to improve the phase lag. However, excessive phase improvement for suppressing the oscillation generates an unnecessary resonance point in the feedback system. This makes it likely that the cutoff speed of the short-circuit current increases too much, and the surge voltage becomes excessive, for the circuit operation. Thus, an optimum value of the phase advance compensation needs to be set in consideration for such conditions.

Figure 4:
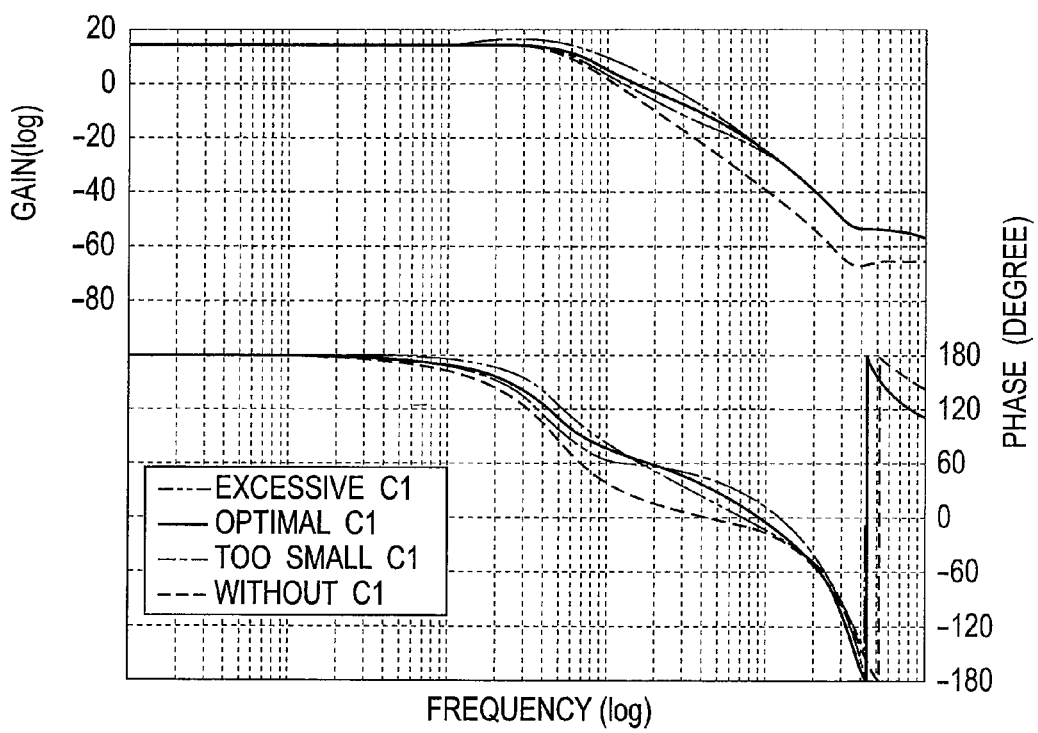
FIG. 4 is an explanatory graph showing simulation results of open loop characteristics of the short-circuit protection circuit 12 shown in FIG. 1.

FIG. 4 is an explanatory graph showing simulation results of effects of advancing the phase of the capacitor C1, and shows an open loop characteristic originating from the base of the NPN transistor Q3. A right descending portion of gain characteristics (where gains decrease with frequencies) shows that the system is the second-order lag system. This is due to the parasitic inductance of the main circuit and the parasitic capacitance of the switching element. In this respect, let us compare the phase margin in the case of the presence of the capacitor C1 and the phase margin in the case of the absence of the capacitor C1. As shown in FIG. 4, it is learned that the phase margin is made better in the case of the presence of the capacitor C1 than in the case of the absence of the capacitor C1.

In addition, it is possible to select an optimum capacitance for the capacitor C1 by adjusting the capacitance of the capacitor C1 in accordance with a frequency characteristic obtained from the parasitic inductance of the main circuit and the parasitic capacitance of the switching element. When the phase margins are compared based on a difference of the capacitor C1, it is learned that the phase margin is improved most when the capacitance of the capacitor C1 is adjusted to the optimum value, as shown in FIG. 4.

Figure 5:
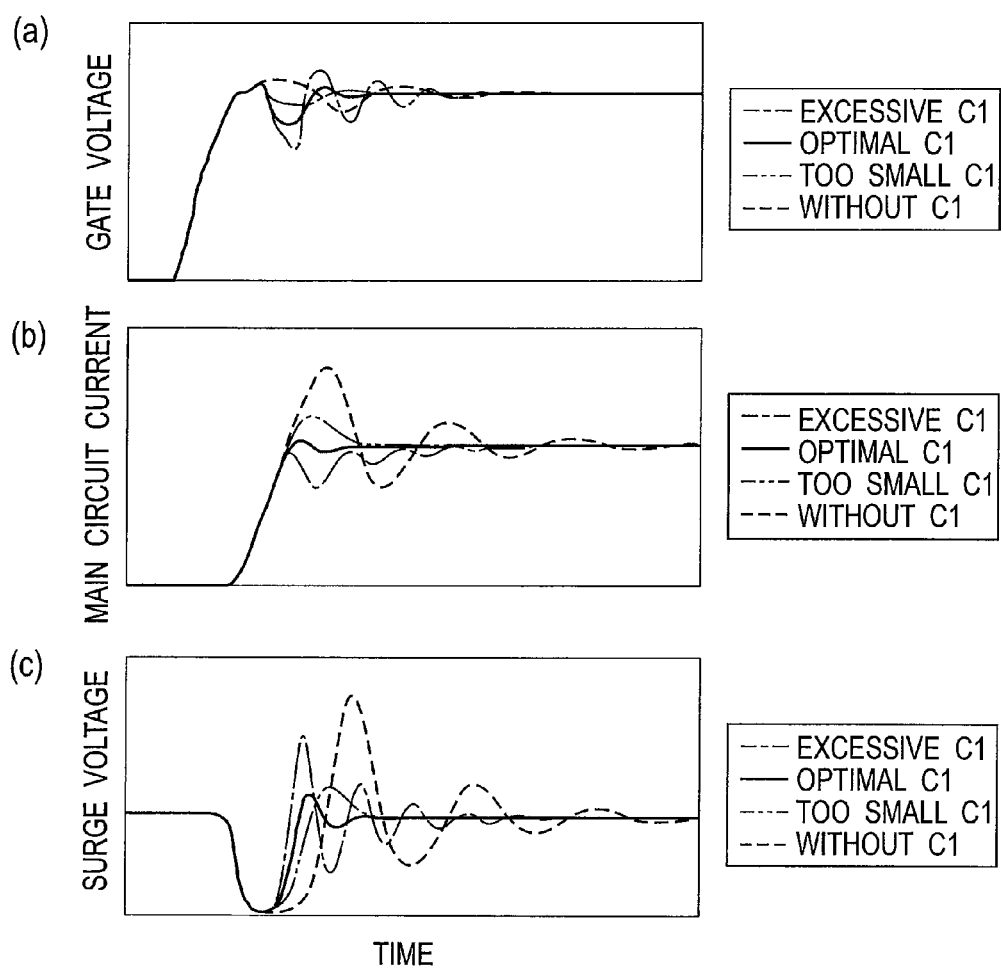
FIG. 5 is explanatory graphs showing simulation results of transient response characteristics of the short-circuit protection circuit 12 shown in FIG. 1.

In addition, an optimum transient response characteristic can be obtained as shown in FIG. 5, by selecting the optimum capacitance by adjusting the capacitance of the capacitor C1 in accordance with the frequency characteristic obtained from the parasitic inductance of the main circuit and the parasitic capacitance of the switching element, as described above. In other words, the capacitance of the capacitor C1 can be defined based on the phase characteristic and the transient response characteristic with respect to the oscillation of the main circuit current (overcurrent) and the surge voltage.

Figure 6:
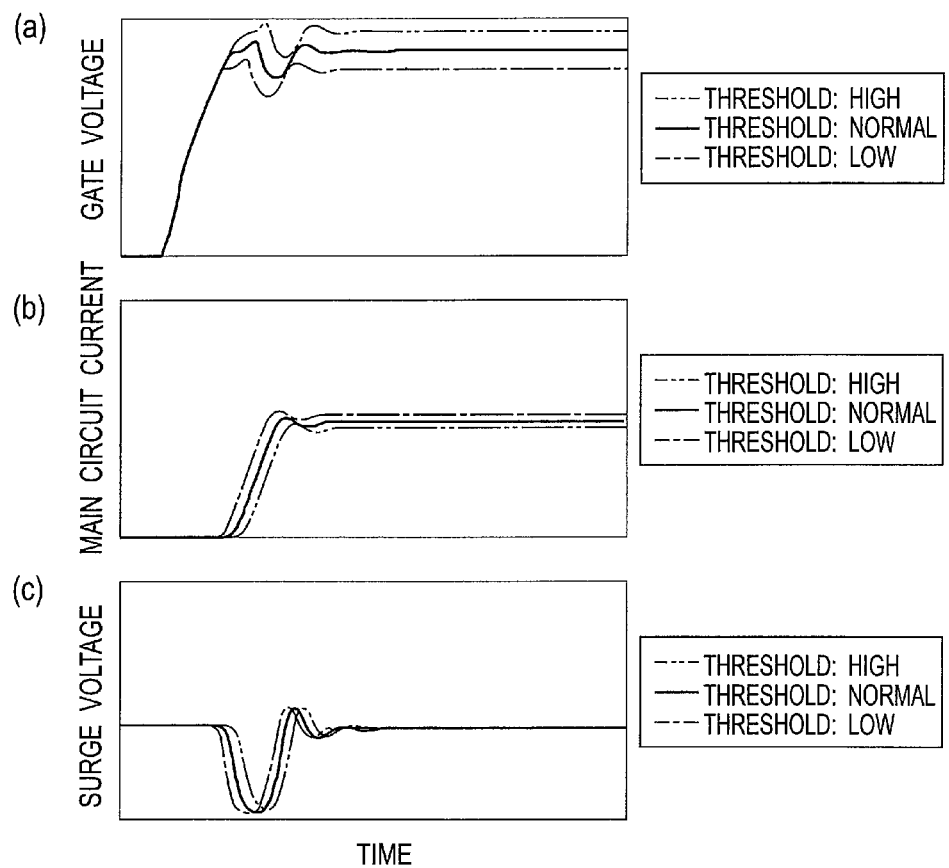
FIG. 6 is explanatory graphs showing simulation results of response characteristics each obtained with a variation in the threshold of the gate of an IGBT taken into consideration.
Figure 7:
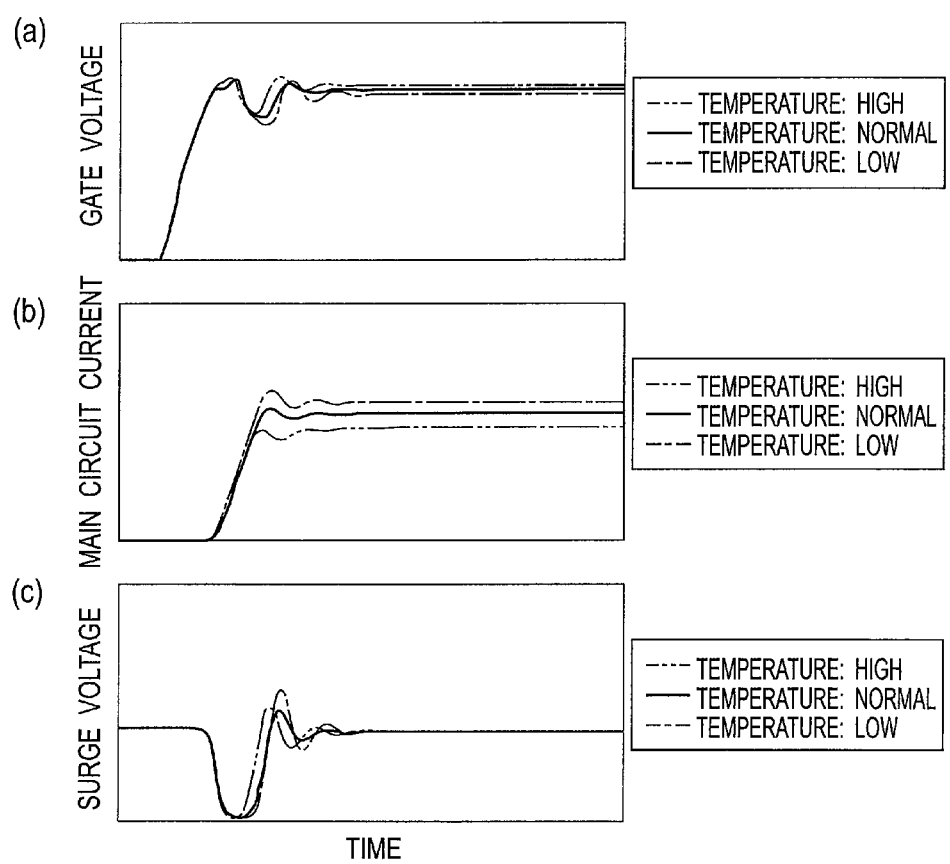
FIG. 7 is explanatory graphs showing simulation results of response characteristics obtained with a variation in the temperature taken into consideration.

FIG. 6 is explanatory graphs showing simulation results of response characteristics each obtained with a variation in the threshold of the gate of the IGBT taken into consideration. FIG. 7 is explanatory graphs showing simulation results of response characteristics obtained with a variation in the temperature of the IGBT taken into consideration.

The parasitic inductance of the main circuit and the parasitic capacitance of the switching element which are main factors of the short-circuit current oscillation have relatively low variation and temperature change. Thus, the driving circuit according to this embodiment can satisfactorily cope with the characteristic variation and the temperature characteristic of the IGBT, even if the capacitance of the capacitor C1 is left at a value predetermined based on the two parameters: the parasitic inductance of the main circuit and the parasitic capacitance of the switching element. It is learned from the simulation results in FIG. 6 and FIG. 7, too, that response waveforms are similar to each other and favorable characteristics having small variation can be obtained. Also in this respect, it is learned that the driving circuit according to this embodiment can cope with the characteristic variation and the temperature characteristic of the IGBT.

This embodiment, as described above, makes it possible to make the current response stable while the main current is suppressed, because the inclusion of the feedback means and the phase advancing means in the short-circuit protection circuit 12 decreases the gate potential quickly at the time of an overcurrent and thereafter suppresses an unstable oscillation of the main circuit. This can suppress thermal destruction which is caused by an overcurrent attributable to the short circuit, and a breakdown due to a breakdown voltage which is caused by an oscillation of a voltage between the collector and the emitter.

Moreover, in this embodiment, the phase advancing means is set based on the frequency characteristic attributable to the parasitic inductance of the main circuit and the parasitic capacitance of the switching element. Because this configuration makes the oscillation of the main circuit current attributable to the parasitic inductance of the main circuit and the parasitic capacitance of the switching element, a constant of the phase advancing means may be obtained from these two parameters. This enables optimum control regardless of the variation in the threshold of the gate and the temperature characteristic of the switching element. To put it differently, the short-circuit protection circuit 12 of this embodiment can extensively cope with variation factors such as the variation and temperature characteristic of the switching element.

Further, in this embodiment, the phase advancing means is set so that the surge voltage generated in the switching element should not exceed the breakdown voltage of the switching element when the main circuit current is an overcurrent. With this configuration, a dielectric breakdown of the switching element can be prevented.

[Second Embodiment]

Figure 8:
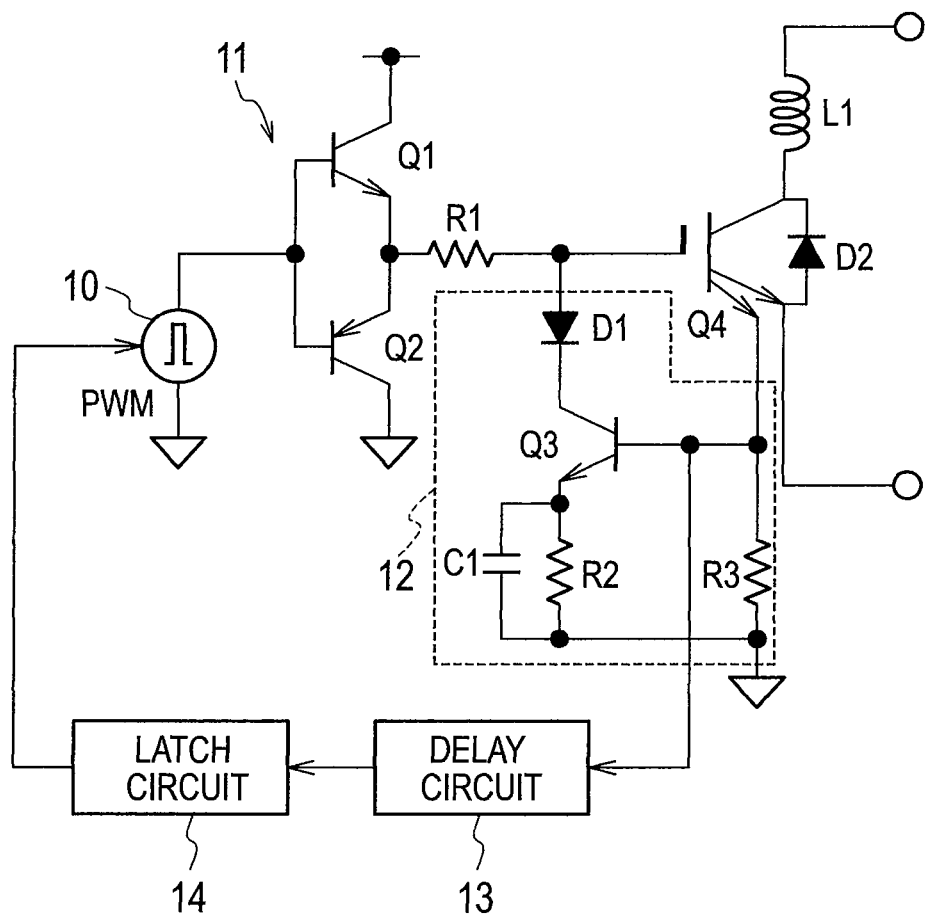
FIG. 8 is a circuit configuration diagram showing a driving circuit for a switching element according to a second embodiment of the present invention.

FIG. 8 is a circuit configuration diagram showing a driving circuit for a switching element according to a second embodiment of the present invention. The driving circuit for a switching element according to this embodiment is different from that according to the first embodiment, in that the driving circuit further includes a delay circuit 13 and a latch circuit 14. Hereinafter, a description of the configuration similar to that of the first embodiment is omitted, and a difference is mainly described.

When the short-circuit protection circuit 12 is made in the driving circuit for a switching element, a cutoff circuit for completely cutting off the main circuit current after the short-circuit current is suppressed by the feedback control is expected to be provided thereto. In this embodiment, for example, as shown in FIG. 8, the cutoff circuit made from the delay circuit 13 and the latch circuit 14 is combined with the short-circuit protection circuit 12. On condition that an overcurrent state lasts for a predetermined time, a gate driving signal is stopped. Specifically, the delay circuit 13 receives a base potential of the NPN transistor Q3, and outputs a delay signal to the latch circuit 14. When the signal from the delay circuit 13 exceeds a threshold, the latch circuit 14 outputs a signal for stopping the gate of the switching element Q4 to the logic circuit 10 and holds the signal. Upon reception of the signal from the latch circuit 14, the logic circuit 10 stops the driving of the gate. Thereby, the cutoff circuit cuts off the gate of the switching element. Note that the delay circuit 13 aims to suppress a malfunction due to a noise. An example of a frequently used circuit includes a low-pass filter based on a first-order RC lag circuit. In the low-pass filter, when a waveform of a signal to the low-pass filter from the short-circuit protection circuit 12 oscillates excessively, an output waveform from the low-pass filter becomes unstable. As the result, a time period for judgment by the latch circuit 14 (a time period required to judge that the signal from the delay circuit 13 exceeds a threshold) may be unstable. Further, if this time becomes too long, the switching element is likely to be thermally destroyed. However, this embodiment makes it possible to securely cut off the main circuit current within a desired period, and to prevent the thermal destruction of the switching element, because: the short-circuit protection circuit 12 fully suppresses the current oscillation; and the input signal to the delay circuit 13 becomes stable.

In this embodiment, as described above, the delay circuit 13 and the latch circuit 14 form the cutoff circuit configured to turn off a conduction state of the gate terminal of the switching element on condition that the overcurrent state lasts for a predetermined time period. The cutoff circuit is required to monitor the overcurrent for a predetermined time period and then to shut down the gate so that a malfunction due to a noise can be prevented. This embodiment prevents the variation in the monitoring period, and makes it possible for the cutoff circuit to shut down the gate within the desired predetermined time period, because the short-circuit protection circuit 12 performs optimum feedback control to stabilize the main circuit current at a constant value in the short-circuit protection operation.

The embodiments of the present invention have been heretofore described. However, these embodiments are only exemplars described for making the present invention understood easily, and the present invention is not limited to the embodiments. The technical scope of the present invention is not limited to specific technical matters disclosed in the embodiments above, and includes various modifications, changes, alternative techniques and the like which could be easily derived from the technical matters. For example, the present invention includes not only the driving circuit for a switching element, but also a power converter including the switching element and the driving circuit. When using the short-circuit protection circuit 12, such a power converter suppresses the current oscillation and the surge voltage, and thus no longer needs a snubber circuit for suppressing the oscillation.

This application claims priority from Japanese Patent Application Number 2009-245625 filed on Oct. 26, 2009, the content of which is incorporated herein by reference in its entirety.

Industrial Applicability

The present invention makes it possible to make the current response stable while the main current is suppressed, because: the short-circuit protection circuit 12 includes the feedback means and the phase advancing means; thereby, the short-circuit protection circuit 12 decreases the gate potential quickly at the time of an overcurrent, and further thereafter suppresses an unstable oscillation of the main circuit current. This makes it possible to suppress thermal destruction which is caused by an overcurrent attributable to a short circuit, and a breakdown due to a breakdown voltage which is caused by an oscillation of a voltage between the collector and the emitter.

Reference Signs List 10 logic circuit
11 gate driver
Q1 source driver
Q2 sink driver
R1 gate resistor
Q4 IGBT
D2 free-wheel diode
L1 coil
12 short-circuit protection circuit
D1 diode
Q3 NPN transistor
R2 resister
R3 sense resistor
C1 capacitor
13 delay circuit
14 latch circuit

The invention claimed is:

1. A driving circuit for a switching element comprising:
a control circuit configured to apply a control voltage to a first terminal of a switching element including the first terminal, a second terminal and a third terminal, and thereby to cause a main circuit current to flow in a main circuit between the second terminal and the third terminal; and
a protection circuit configured to protect the switching element when the main circuit current is an overcurrent, wherein
the protection circuit includes:
a potential decreasing unit configured to decrease a potential of the first terminal when the main circuit current is the overcurrent,
a feedback unit configured to perform feedback control on an amount of a decrease in the potential of the first terminal caused by the potential decreasing unit according to a current amount of the main circuit current, and
a phase advancing unit configured to perform phase advance compensation in a feedback loop under the feedback control.

2. The driving circuit for a switching element according to claim 1, wherein the phase advancing unit is set based on a frequency characteristic attributable to a parasitic inductance of the main circuit and a parasitic capacitance of the switching element.

3. The driving circuit for a switching element according to claim 2, wherein the phase advancing unit is set so that a surge voltage generated in the switching element does not exceed a breakdown voltage of the switching element when the main circuit current is the overcurrent.

4. The driving circuit for a switching element according to claim 1, wherein
the potential decreasing unit decreases the potential of the first terminal via a diode by making an NPN transistor conduct based on a voltage generated by a sense resistor connected to a sense terminal branched from part of the third terminal of the switching element,
the feedback unit is formed from a resistor connected to an emitter terminal of the NPN transistor, and
the phase advancing unit is formed from a capacitor which is connected to the resistor on an emitter side of the NPN transistor in parallel.

5. The driving circuit for a switching element according to claim 1, further comprising a cutoff circuit configured to turn off a conduction state of the first terminal of the switching element on condition that an overcurrent state lasts for a predetermined time period.

6. A power converter comprising:
a switching element including a first terminal, a second terminal and a third terminal; and
the driving circuit for a switching element according to claim 1.

7. A driving circuit for a switching element comprising:
a control circuit configured to apply a control voltage to a first terminal of a switching element including the first terminal, a second terminal and a third terminal, and thereby to cause a main circuit current to flow in a main circuit between the second terminal and the third terminal; and
a protection circuit configured to protect the switching element when the main circuit current is an overcurrent, wherein
the protection circuit includes:
potential decreasing means for decreasing a potential of the first terminal when the main circuit current is the overcurrent,
feedback means for performing feedback control on an amount of a decrease in the potential of the first terminal caused by the potential decreasing means according to a current amount of the main circuit current, and
phase advancing means for performing phase advance compensation in a feedback loop under the feedback control.

* * * * *